United States Patent [19]
Hutt et al.

[11] Patent Number: 4,931,725
[45] Date of Patent: Jun. 5, 1990

[54] ELECTRONIC ELECTRICITY METERS

[75] Inventors: Peter R. Hutt; Stephen Day, both of Winchester, England

[73] Assignee: Polymeters Response International Limited, Winchester, England

[21] Appl. No.: 131,061

[22] Filed: Dec. 10, 1987

Related U.S. Application Data

[63] Continuation of Ser. No. 790,620, Oct. 23, 1985, abandoned.

[30] Foreign Application Priority Data

Oct. 23, 1984 [GB] United Kingdom ............... 8426822

[51] Int. Cl.$^5$ .................. G01R 21/06; G01R 1/38
[52] U.S. Cl. ................................ 324/142; 324/130; 364/483
[58] Field of Search ............... 324/142, 130; 364/483; 328/160

[56] References Cited

U.S. PATENT DOCUMENTS

| | | | |
|---|---|---|---|
| 3,879,724 | 4/1975 | McDonald | 340/347 |
| 4,056,774 | 9/1977 | Shum | 324/142 |
| 4,257,004 | 3/1981 | Miller | 324/142 |
| 4,282,576 | 8/1981 | Elms et al. | 324/142 |
| 4,345,311 | 8/1982 | Fielden | 324/142 |
| 4,459,546 | 7/1984 | Arrington et al. | 324/142 |

FOREIGN PATENT DOCUMENTS

| | | |
|---|---|---|
| WO83/03011 | 9/1983 | PCT Int'l Appl. |
| 2066969 | 1/1980 | United Kingdom |
| 2041588 | 9/1980 | United Kingdom |

Primary Examiner—Ernest F. Karlsen
Attorney, Agent, or Firm—Watson, Cole, Grindle & Watson

[57] ABSTRACT

Apparatus whose measurement means consists solely of electronic components, measures the power taken by an electrical load connected to an alternating source of electricity supply in such a manner that the power sensed or energy accumulated is in agreement with the same measurements as performed by a conventional rotating disc electromechanical meter. Fundamental frequency filtering means when applied to either one or both supply voltage and load current ensure that the electronic circuitry performs the appropriate measurements in determining power consumption. A single sample per mains cycle applied to load current and supply voltage is sufficient to measure power consumption, energy consumption accumulation, and produce accumulated energy pulses appropriate to measurement of real power, true power and volt-ampere power consumed by the load. Similar multiphase meters apply the fundamental frequency filtering means to each load current and optionally to each supply voltage to extend the method used in single-phase meters. To improve accuracy of the measurements where an analogue to digital converter is used the current signal, and optionally the supply voltage signal, is perturbed by a Quantisation Error Dispersion (Q.E.D.) signal. Various circuits are described to generate the Q.E.D. signal and the essential properties of the signal are defined.

10 Claims, 7 Drawing Sheets

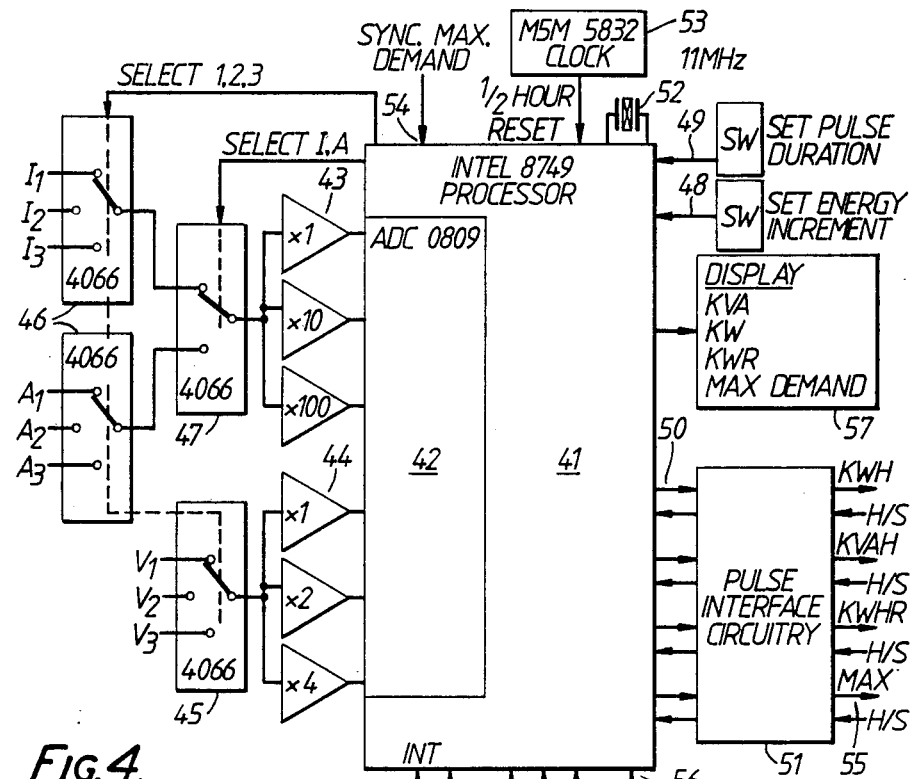
FIG. 4.
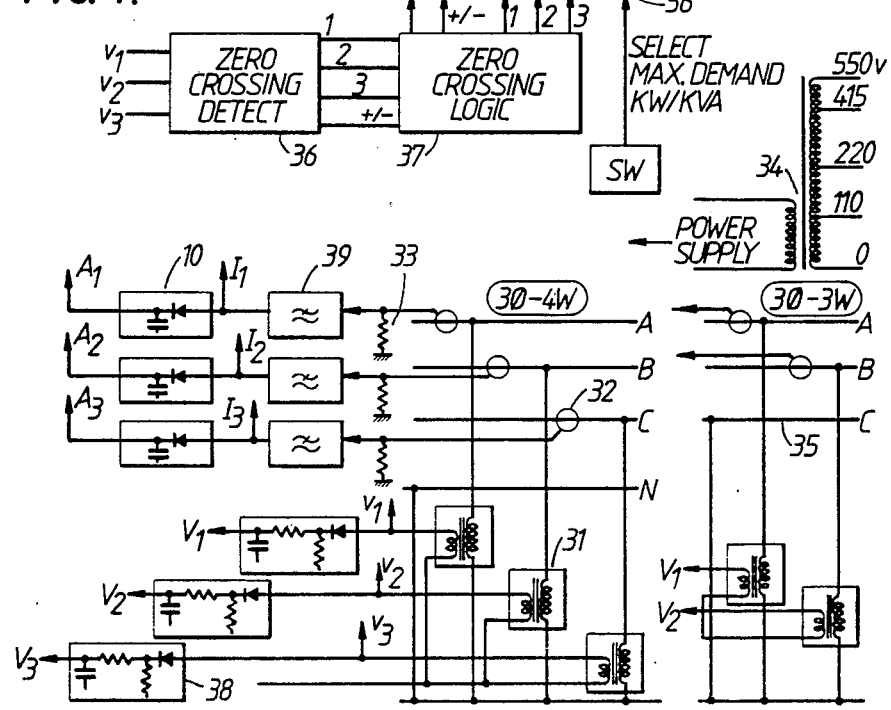

ELECTRONIC ELECTRICITY METERS

This application is a continuation application of application Ser. No. 790,620, filed Oct. 23, 1985, now abandoned.

This invention relates to measure of electrical power and energy using sampling solid state electronic meters. The invention relates to meters for use in single- and three-phase systems and to methods for producing grreater accuracy in such meters.

The usual electricity meter found in homes and in industry is of the electromechanical, induction wheel type. Such meters operate by generating magnetic fluxes proportional to instantaneous voltage and current values in the load to produce eddy currents in an aluminium disc, thus causing it to rotate. In single-phase systems a single coil responsive to load current value and another at right angles responsive to supply voltage produce the magnetic fluxes. In 2-phase, 4-wire systems three sets of current and voltage coils are used, where voltage in each coil is measured relative to neutral. In 3-wire systems, where no neutral conductor is provided, a different electromechanical configuration is necessary. Rotation is proportional to energy used and speed of rotation is proportional to power use at that time. Displays of totalised energy used are incorporated in these meters and some have the extra facility of generating electrical pulses for transmission to indicate that a certain unit of energy has been used.

Electromechanical meters are robust and accurate over a wide range of power consumption. However, advances in the field of electronics have enabled solid state meters to be produced which can be more easily integrated into systems requiring remote interrogation. Also with minaturisation of electronic components such meters are becoming more compact and competitively priced.

Known solid state electronic meters generally use analogue multipliers to combine instantaneous sensed valueds of voltage and current to produce a series of pulses whose rate is proportional to instantaneous power in the load. A recently developed electronic meter disclosed in U.K. 2 041 588B incorporate a microprocessor which works on digital signals corresponding to samples of voltage and current in the load. In one embodiment a single sample of current and voltage are taken per half-cycle of the supply voltage, to calculate the value of power flowing to the load. This method is described as accurate when the load is linear but for non-linear loads a higher sampling frequency is necessary to obtain the same accuracy. Also, it is a feature of the sampling process that if the sampling frequency is an even number of samples greater than eight per half-cycle of supply voltage then the accuracy of the energy estimate for a linear load depends almost entirely on the accuracy of the analogue to digital conversion.

This invention relates to a sampling electronic electricity meter, incorporating circuitry for improvement of the analogue to digital conversion of both current and voltage by a means to be described and termed Quantization Error Dispersion.

Before considering the circuitry for improving accuracy of the ADC it is instructive to discuss in some detail the structure of the basic electronic electricity meter to which it is applied.

The invention provides single- and multi-phase meters which accurately measure real, reactive and apparent power in a linear or non-linear load along with the associated energies over a large range of power consumption. These meters simulate the power measurements effected by an electromechanical rotating disc meter commonly used for electricity measurement.

The present invention provides electricity metering apparatus comprising first sensing means for detecting the fundamental supply frequency component of load current and second sensing means for detecting the supply voltage, means for identifying the zero crossing times of supply voltage, means for sampling the fundamental supply frequency component of load current at times bearing a fixed relationship to the supply voltage zero crossing times and producing a voltage indicative of the magnitude and phase of the sampled fundamental frequency component of the load current, and calculating means for combining the signals indicative of load current and sensed supply voltage to produce a value for power flow to a load in one half-cycle of supply.

The present invention further provides apparatus for measuring multi-phase alternating electricity supply consumption, and comprising first sensing means for detecting the fundamental supply frequency component of load current for each of a plurality of phases, second sensing means for detecting supply voltage for each detected current, means for identifying the zero crossing times of the supply voltages, means for sampling the fundamental supply frequency component of each load current at times bearing a fixed relationship to the zero crossing time of the respective supply voltage and producing a voltage proportional to both magnitude and direction of that component of current flow in the load, calculating means for combining the signals indicative of each load current and respective supply voltage to produce component power flow values and a total power flow value derived from the algebraic summation of the component power flow values.

The present invention further provides an electronic electricity metering apparatus comprising voltage and current sensing means, means whereby voltages are derived proportional to the voltage magnitude and the amplitude and phase of the fundamental supply frequency component of the load current, voltage generation and addition means for adding a cyclically varying voltage to the current-derived voltage, an analogue to digital converter sampling the output of the voltage addition means, a digital processor controlling said analogue to digital converter effects samples of voltage and load current at a frequency different from the supply frequency and calculates therefrom power and energy taken by a load from a source of electrical alternating current supply, and the added voltage having a peak-to-peak value equal to an integer number of digitising levels, possessing a rectangular probability density distribution and having a frequency different from the supply frequency.

BRIEF DESCRIPTION OF THE DRAWINGS

Features and advantages of this invention will become apparent from the more detailed description of particular embodiments thereof, given by was of example with reference to the accompanying drawings, of which:

FIG. 4 shows an embodiment of a complete 3 phase, 3 wire/3 phase, 4 wire power and energy meter;

Figure 1:
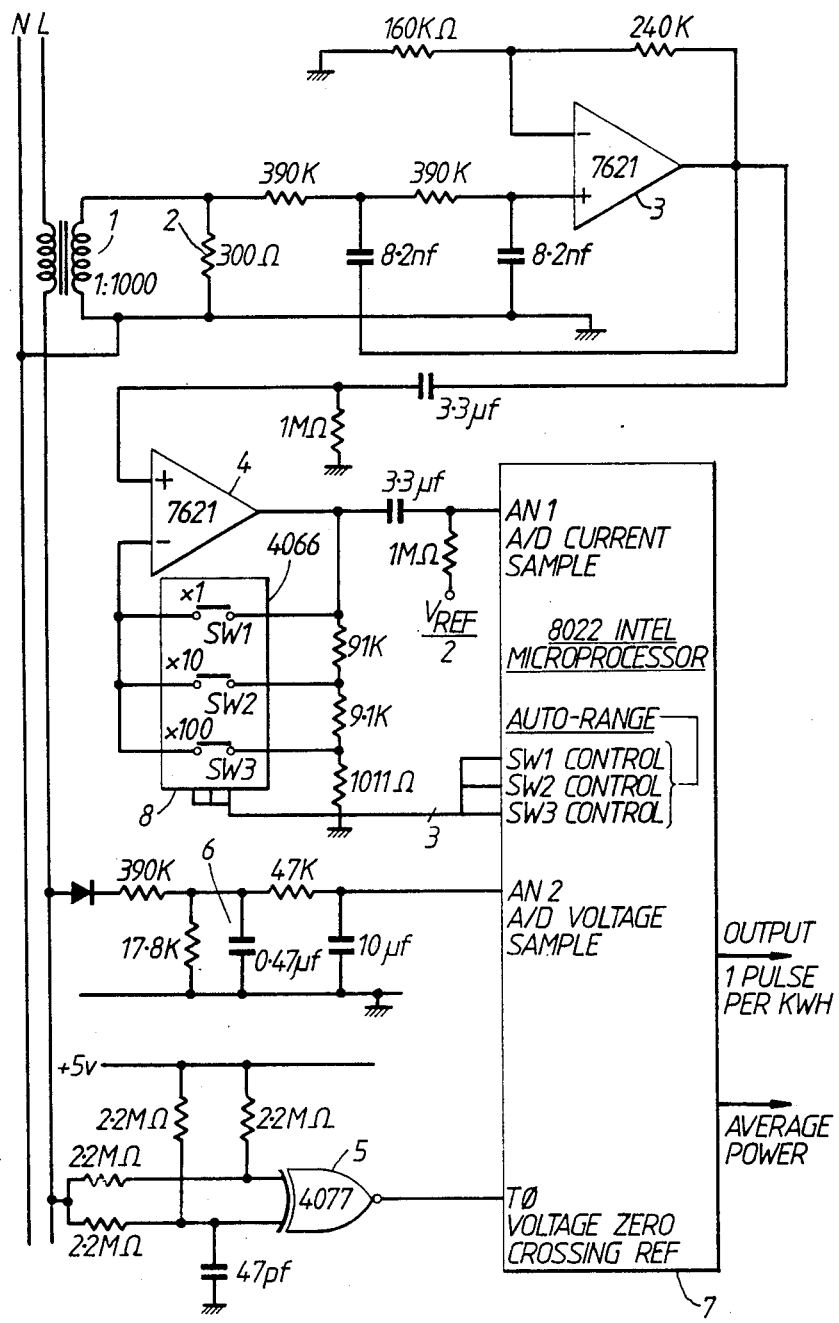
FIG. 1 is a circuit diagram of a circuit to simulate the implementation of the Ferraris Wheel, the electromechanical device used in many electricity meters.

The general principles on which these solid state meters operate will be described with reference to single-phase supplies. It is necessary first of all to see how the mathematical representation of power measurement applies when considering electromechanical meters.

The supply voltage is nominally sinusoidal but it may be represented by a function, $V_s(t)$ and the Fourier expansion of this function in terms of harmonics, $V_n$, of the basic frequency, ws, of the mains supply. Omitting phase angles, $$V_s(t) = V_c + V_1 \cos w_s t + \ldots + V_n \cos n w_s t$$

also similarly $$i_s(t) = i_o i_1 \cos w_s t + \ldots + i_m \cos m w_s t.$$

The load current and supply voltage are sensed, the instantaneous power is computed from them by a multiplier or power sensing component and averaged by an averaging circuit. Supply frequency is sensibly constant so that the subscript, s, can be dropped from the symbol for frequency.

Instantaneous power P(t) is thus, $$p(t) = \sum^n V_n \cos nwt \times \sum^M i_m \cos mwt$$

power averaged over one period, T, of the main supply is then $$P = \frac{1}{T} \int_0^T \left[ \sum^n \sum^m V_n i_m \cos nwt \cos mwt \right] dt$$

The general term after performing the double summation function will be $$O_{nm} = \frac{1}{T} \int_0^T V_n i_m \cos nwt \cos mwt \, dt$$

This Pnm will only have non-zero values if n amd m are equal or if either is equal to zero. Hence the power function is $$P = \sum_{n=0}^{\infty} P_{nn} + \sum_{n=1}^{\infty} P_{on} + \sum_{n=1}^{\infty} P_{no}$$

This is the function evaluated by a true power meter, including any d.c. terms present arising from from $V_o$ and $i_o$ components in the above power formula.

A commonly used electromechanical meter, the Ferraris wheel, computers power by the interaction of fluxes which are instantaneously proportional to both current and voltage in the load. The mechanism of the Ferraris wheel cannot induce torque dependent on dc components of either current or voltage hence only the following terms can be sensed $$P = \sum_{n=1}^{\infty} P_{nn} = \frac{1}{T} \int_0^T [v_1 i_1 \cos^2 wt + \ldots + v_n i_n \cos^2 nwt +] dt$$

i.e. the Ferraris wheel only responds to the fundamental component at mains frequency plus similarly interacting harmonies of load current and mains voltage.

But if we examine the above expression for power and assume that the mains voltage is sinusoidal it is possible to simplify the expression for average power even further so that $$P = P_{11} = \frac{1}{T} \int_0^T v_1 i_1 \cos^2 wt \, dt$$

We can ensure that only the fundamental of mains voltage is present by introducing a low pass filter with a sharp cutt off above the mains frequency w on the voltage sense input. The output of the multiplier after averaging reflects only the mains frequency voltage fundamental multiplied by the fundamental of the load current component. It is possible therefore without changing the systems output in any way to insert a fundamental frequency filter also on the current sensing voltage. The final output of this circuit (after averaging) remains the same, the difference that at the multiplier output no power components above 2 w can be present since fundamental filtering is present on both sensing inputs.

Now the output of the multiplier with both input filtered is given by the expression $$p(t) = v_1 \cos wt \times i_1 \cos wt$$

and the average fundamental power at the system output is given by $$P = \frac{1}{T} \int_0^T v_1 i_1 \cos^2 wt \, dt$$

When the voltage and current are out of phase by an angle $\phi$ the well known expression for ac power in a linear load results.

$$P = VI \cos \phi$$

Where V and I are the RMS values of the inputs to the multiplier, equivalent to the fundamental components of supply voltage and load current.

So by sampling voltages varying in proportion to the mains voltage fundamental and the load current fundamental both at their peaks, and also sensing the phase between these fundamentals, the average power over one or several cycles can be computed. The power that is sensed by this means will be equal to the power sensed by the Ferraris Wheel meter apart from a small error due to harmonic distortion of the mains nominally-sinusoidal voltage. This will be true for all types of current load, both sinusoidal and non-sinusoidal, that is for both linear and non-linear loads.

Since this Ferraris Wheel simulation employs simply sensing and sampling of two sine wave voltages we can measure the voltage of the two sensed voltages at their peak, or the voltage of both at the peak of one, preferably the voltage wave-form peak since the electricity supply voltage is always close to a sinusoid.

Due to the fact that the point of sample of the current waveform is shifted by $\phi$ from an in-phase position and the input waveform is sinusoidal, a sampling of $i_1$ at the voltage peak produces $I \cos \phi$ directly without further computation. The multiplier in this circuit needs only to respond to two sampled inputs to produce the desired fundamental power.

When the aforegoing principles are extended to measurement on general three-phase systems problems arise due to phase relationships of the various supply voltages and the associated line current.

Depending on the connections made between the wires it is possible that the phase of a line current with respect to an associated voltage can be greater than $\pm 90°$. So it is important to sense both magnitude and direction of a sampled current. By sensing direction we are assured of sensing the negative power contribution that can occur in one current-voltage pair power measurement, even though the net power in all conductors must be positive for a power-absorbing load.

Figure 2:
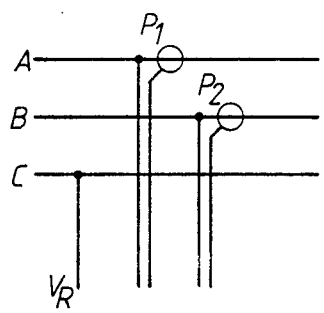
FIG. 2 shows a connection of measuring apparatus in a 3 phase, 3 wire system.

In general it can be seen that by considering any of n wires as a reference or "chassis" the total power is measured by making n−1 power flow measurements on the n−1 remaining conductors each paired with "chassis". A number of different connections are clearly possible. FIG. 2 shows one connection of measuring apparatus to sense total power for a 3-wire system and FIG. 3 a connection for a 4-wire system.

Figure 3:
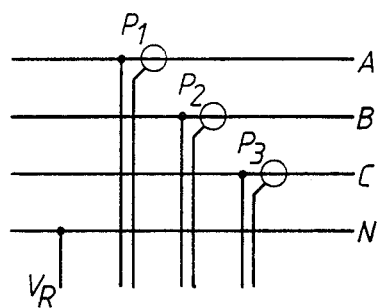
FIG. 3 shows a connection of measuring apparatus in a 3 phase 4 wire system.

Since the one apparatus is designed to be capable of measuring either 3 or 4-wire systems it follows that the voltage sensing must be capable of accepting phase to phase voltages as on FIG. 2 as well as phase to neutral as in FIG. 3. It can be seen that the chassis connection is made by a voltage probe $V_R$ to one conductor. Pairs consisting of a current transformer and a voltage probe or connection labelled as $P_1, P_2$ and $P_3$ are made to the conductors.

Power is monitored independently on each pair so that any pair can be associated with any conductor. In the 3 phase 3 wire system one pair is just not connected and consequently senses no power. When power to drive the equipment is taken from the same supply that is being measured it is only necessary to ensure that the voltage connections from the monitored circuit are also routed approximately to provide power to the power supply of the meter.

Having described the connection of voltage and load current sensors it is now instructive to describe the principles of the power measurement. This is effected by taking a single sample of the sensed 50 Hz filtered current waveform passing through the current transformer at the time of the voltage maximum on the associated voltage probe. Multiplication of the current sample by the probe voltage is then proportional to the energy consumed in that ½ cycle period of 10 milliseconds on that phase or line current with respect to "chassis" or common.

In both single- and 3-phase systems variation in timing of sampling is used to produce values for real power, reactive power and volt-amperes power. Reactive power, $VI \sin \phi$, is measured by sampling the current derived voltage at a point coincident with the voltage zero crossing time. Volt-amperes, VI, is measured by sampling the current derived voltage at its peak. Power consumption per half-cycle is accumulated in the meters to give a measure of totalised energy consumption and means may be provided whereby an electrical pulse is produced after consumption of a set unit of energy. Facilities can be incorporated in the meters whereby a measuring period can be initialised and terminated by a user. Remote access to the meters can also be easily provided using wires to transmit information from the meters to a remote point and receive information and/or instructions to the meters from a remote point.

In practice the principles and objectives of the invention described above can be carried out in a manner described below.

In the embodiment of FIG. 1 the current is sensed by a current transformer 1.

The voltage produced across the load resistor 2, is proportional to the instantaneous ac current flowing in the load. This voltage is filtered by an active filter, 3, to leave only the 50 Hz fundamental frequency as output of the filter.

This active filter has a gain of approximately 5 and the output is a sine wave varying in sympathy with the fundamental component of the load current.

The output of the filter is ac coupled to an amplification stage. The ac coupling removes any active filter dc offset. The amplifier stage 4, has switched variable gain to allow for auto-ranging to gain over 3 decades, to measure current varying typically from 1 to 1000 amps load current.

The overall gain of the two stages in series is conveniently set to unity, ×10 and ×100 by appropriate resistors in the attenuation amplifier, 4. An appropriate output swing of the amplifier is 5 volts peak to peak. In this particular implementation CMOS amplifiers 7611 are employed.

The filter employed has an intrinsic phase shift of 90° at 50 Hz but since the mains voltage remains very close to 50 Hz at all times the phase shift remains sensibly constant and predetermined.

The phase reference provided by the ac voltage is detected in this implementation by the circuit 5. This is directly connected to the mains to produce a negative output pulse with its leading edge occurring at the zero crossing of the mains. Due to the 90° phase shift on the current sensing voltage this point corresponds, conveniently to the peak of the current sense sinusoid for resistive loads.

As a consequence where there is a phase shift of the current the magnitude of the current sinewave sensing voltage is proportional to $I \cos \phi$ at the time the voltage zero crossing occurs.

The circuit 6, detects a voltage which is proportional to the mains voltage by process of half wave rectification and dc low-pass filtering. This produces for convenience a dc voltage of 5 volts for a mains voltage of 255 volts ac. This is the input, V, required to complete multiplication VI cos $\phi$ and is very close in practice to the value that would be determined from the fundamental component of the mains voltage, since mains voltage is close to sinusoidal.

In this particular embodiment digital samples of I cos $\phi$, and V are derived from the two input analogue channels of the processor 7, in this case an Intel 8022 microprocessor. In this embodiment the two analogue voltages are combined by a process of analogue to digital conversion of I cos $\phi$ and V with appropriate sampling time being dictated by the TO voltage zero crossing input. The 8022 processor multiplies the two digital samples to derived energy within the $\frac{1}{2}$ cycle and accumulates each contribution, the resultant output being a pulse for every increment (say 1.0 KWh) of energy consumed as well as producing another digital signal indicative of the average power.

Another of many possible alternative embodiments would be to use a separate analogue to digital conversion device electronically switching between I cos $\phi$ and V signals, and providing digital sampled values to an 8035 and 8748 or any other similar digital processing circuitry.

In the particular embodiment described we show how the processor, 7, can control the analogue switch 8, to auto-range the measurement circuitry for improved accuracy over several decades of power variation via the 4066 analogue switch 8.

FIG. 4 shows a complete embodiment of a solid state 3 phase, 3 wire/3 phase 4, wire power and energy meter. Facilities provided by this detailed embodiment include the following:

Displays of True power KW
Apparent power KVA
Reactive power KWR
Maximum demand in previous maximum demand period (KVA or KW).
A time reference input for establishing maximum demand periods.
A time reference reset input for external synchronisation of maximum demand periods.
Pulses indicative of
True energy KWh
Reactive energy KWhR
Apparent energy KVAh.
A data transmission facility for relaying maximum power demand.
Handshake facilities for resetting output energy pulses optionally employed by an external controller sensitive to the energy pulses.

In this specific embodiment voltages V1, V2, V3 are provided as outputs from the voltage isolating transformers 31. The voltage outputs follow the voltages between the selected common (in this diagram it is Neutral) and the phase voltages.

The body of the circuitry can be at earth potential since the monitored voltages are isolated.

Current transformers 32 produce currents which are typically 1/1000 of the current circulating in the three line conductors.

The current transformers can be of any standard type. These output currents are intrinsically isolated from the supply and can feed directly to load resistors 33, typically of value 3 ohms for a maximum load current 100 Amp or 0.3 ohms for a maximum load current of 1000 Amps. The power supply 34 can be fed from the load supply or a separate source as is most convenient.

An alternative measuring connection 35 is shown when the apparatus is used to measure a 3 phase, 3 wire supply. One pair or voltage-current measuring sensors is just not connected.

Voltages V1, V2, V3 are utilised directly to detect the times of their zero crossings in the zero crossing detect circuits 36 and zero crossing logic 37. Outputs from the zero crossing logic indicate the time of occurrence of the zero crossing, which voltage it has occurred on, and whether it is on the positive-going or negative-going portion of the cycle.

A dc level indicative of the amplitude of the three voltages V1, V2, V3 is derived by process of rectification and detection of the mean level of the rectified signal in the voltage level detect circuits 38. Such a process gives a voltage which is reliably proportional to mains RMS voltage even in the presence of noise spikes and as long as the mains is near to sinusoidal.

The three currents I1, I1 and I3 are sensed in the load resistors 33 and fed into 50 Hz low pass filters 39. The output of these filters is such that there is a 40 dB rejection at 150 Hz so that the filter output is near to sinewaves when multiplied by the associated voltage amplitude is directly proportional to the power in each circuit.

The filtered outputs are peak detected in the current amplitude circuitry 40. The amplitude of these current voltages when multiplied by the associated mains voltages is directly proportional to the voltamperes in the measured load.

In order to derive total 3 phase power the processor 41, in conjunction with an analogue to digital converter 42, must measure all three voltages V1, V2, V3 and three current voltages.

For true power the current voltage X is proportional to the current (I cos $\phi$) at the filter output at the time of the peak of the associated voltage V and $\phi$ is the phase difference between V and I.

When sensing KVA, apparent power, the peak detected currents A1, A2, A3 can be sampled at any time since the time constant of these circuits is several cycles of mains voltage and remain sensibly constant in one cycle of mains.

The ADC utilised in this embodiment is an 8 bit analogue to digital converter with 8 separate selectable analogue inputs. 3 each of these are utilised as current inputs from the current amplifiers 43 and voltage amplifiers 44.

Selection of voltage to be measured is effected by control of the quad bilaterial switch 45, a CMOS 4066 integrated circuit.

Selection of current phase to be measured is effected by control of the parallel quad bilateral switches 46. Selection of I or A is effected by control of the two way switch 47. Selection of I effects measurement of a varying voltage and software in the processor decides the timing for a sample I sin $\phi$ (reactive) or a sample I cos $\phi$ true power component. Selection of the slowly varying A allows a sample to be taken any time convenient to the processor.

At all times it is the processor and its program which is controlling the analogue switches according to the dictates of the zero crossing inputs to effect the right sample measurements of the correct time and in the correct sequence.

In order to preserve good accuracy the current inputs to the processor are multiplied by 1 by 10 and by 100. This means that a range of currents varying over a 1000 to 1 range can be accurately sensed. In order to cope with the requirement for phase to neutral and phase to phase voltage inputs typically 240 and 415 volts respectively three ranges of voltage sensing inputs are provided to the processor. By having gains of X1, X2, X4 voltages between 110 V and 550 V can be measured and maintain an accuracy of 1%. For both current and voltage inputs the processor decides by examining the output of each amplifier which is the appropriate amplifier in range for that measurement.

The processor provides pulse outputs indicative of set increments of energy. The energy increment is set to 10 Wh, 100 Wh, 1 KWh or 10 KWh by the input 18. Pulse duration (or handshake option) is set by inputs 49 at 1 sec at 60 seconds 1/10 second 1/100 second or handshake.

Pulse outputs are provided 50 for true energy, apparent energy and reactive energy driving through pulse interfacing circuitry 51. The pulse interfacing circuitry provides opto isolated 10 mA signals and clean relay output circuits for interfacing the pulses to other equipment. The handshake input is also opto isolated and accepts up to 50 mA input current. In order to effect all the necessary samples and multiplications within the mains cycle time, a 8749 processor is utilised running at 11 MHz controlled by the crystal 52.

A peripheral clock chip 53, provides a ½ hour or other period time reference. This can be synchronised to an external interval reference by the maximum demand input 54. The processor then keeps a record of the maximum power drawn by the load in each half hour (or other) period.

The maximum demand output is in the form of a serial digital signal, 55, indicative of the maximum demand, repeated at intervals and available for reception by an external controller. The maximum demand quantity can be selected to be either KVA or KWatts according to the select input 56.

In this embodiment a display 57 is provided which allows the display to output information from the processor. The display indicates the load true power, apparent power and reactive power as well as the maximum demand of true, apparent or reactive power in the current half hour maximum demand period.

The embodiment of FIG. 1 simulates the amount of electricity consumption shown by the Ferraris Wheel meter typically to within 1% of the Ferraris Wheel meter over a range of 0.1 to 1000 Amps for any type of linear or non-linear load.

As mentioned before accuracy is often limited by the accuracy of the analogue to digital converter (ADC) used in the sampling process. Often as in FIGS. 1 and 4 an 8-bit ADC is utilised for sampling then, inherently, the sampling accuracy cannot be greater than 1/256 of the full range of the measured voltage. If the range of the ADC is used to measure the peak-to-peak current waveform than accuracy is inherently reduced to 1/128, a little between than 1% of full scale. This is adequate for metering when power is at full scale, but for power at 10% of full scale the accuracy is reduced to 10% which is quite inadequate.

It is often the case that inherent variation of load current will spread the current measured continuously over many sampling levels with the result that in a linear amplification system the power measured over time will converge towards a true value by the natural process of averaging.

Nevertheless, for constant and especially low current loads, and particularly over short time periods, this natural averaging effect will be inadequate. This is especially true when meters are subject to testing procedures using a constant voltage and a constant load current.

An object of the use of QED is to ensure that the averaging process occurs for all and especially constant loads, so that under all circumstances, even as low as 1% of full load, an accuracy of power measurement of 1% or better is still maintained.

In order to achieve this, it is preferred to add an additional signal to each current-related sensing voltage, which so disperses the current signal measured by the analogue to digital converter, that during the period of the additional signal—a dispersion signal—a true power is measured having an accuracy of 1% or better for all load levels. This signal is termed the Quantization Error Dispersion (QED) signal.

Figure 5:
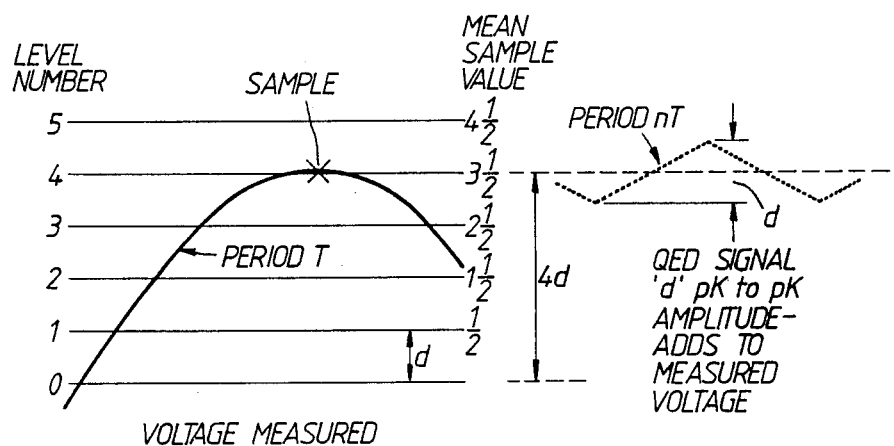
FIG. 5 shows the principle of quantization error dispersion (QED) with reference to a measured sinusoidal current waveform voltage.

FIG. 5 illustrates the quantization levels applied resulting from sampling a sinusoidal voltage waveform. It can be seen that a simple sampling of the ½ sine wave will result in a sample 4½ levels high, whereas the true level is 4 levels i.e. an over estimate of 10%. If however a signal is added to the input sine wave, such that the sampled value is dispersed equally above and below level 4 over a number of samples or cycles, then there will be an equal number of 3½ samples and 4½ samples and the average will converge to 4 digits; the true value.

If the current waveform value is such that it lies at any other proportionate distance between two sampling levels the effect of the one bit amplitude, QED is, by simple proportion going to so distribute the sampled digitised values that the averaged result of all samples will approach the true and actual voltage.

A number of possible signals will effect this required averaging process. The essential features are that the QED signal must be exactly equal to an integral number of quantization levels in peak to peak amplitude, must have zero dc content and possess a uniform, i.e. rectangular, probability distribution function.

The most convenient waveforms are either a triangular or a sawtooth waveform with a peak to peak value of one quantization level. The period of this waveform effects the accuracy improvement. The longer the period, and hence number of mains cycles covered in one period, the better the accuracy improvement. The improvement factor is equal to the number of mains cycles occurring in the QED waveform period. However, it should not be so long as to approach the natural time constant of variation of load current or mains voltage.

Typically a QED period of time from 15 to 50 mains cycles is a good compromise. Also a triangular waveform is practically better than a sawtooth. Alternatively a high frequency QED waveform, which is asynchronous with the mains, is equally effective since this still has a rectangular probability distribution function and still has the effect of randomly and evenly distributing samples over a quantization amplitude interval, though not so systematically as with the long period of QED.

Again for simplicity the QED method will be described as it applies to single-phase systems, the extension to 3-phase systems is straightforward.

A number of circuits for injecting the QED into the current or voltage signal before sampling are possible. A number of embodiments of such circuits will now be described in detail.

FIG. 5 shows the general principle of uniformly distributing sampled values around digital sampling levels, such that an average of all samples over time approaches the true level of the signal.

Figure 6:
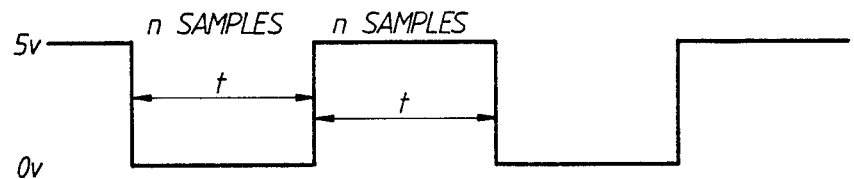
FIG. 6A shows a first circuit for QED generation and FIGS. 6B and 6C show waveforms of the FIG. 6A circuit.
Figure 6:
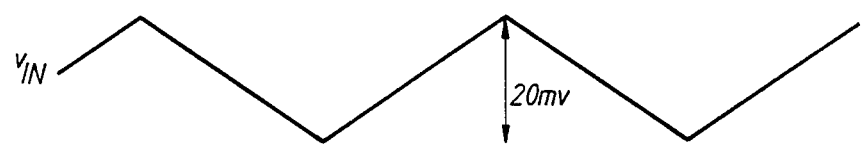

FIG. 6 illustrates a simple RC circuit for generating a triangular voltage waveform. Correct choice of component values R and C, gain of the amplifier, and the period of the square wave produced at the processor port determine the period and peak to peak amplitude of the QED signal.

In this circuit the triangular wave is derived from a square wave produced at the microprocessor port switching typically from 0 to 5 volts and back at time intervals of n samples. R and C are chosen such that the time constant is sufficiently long relative to time and that the peak to peak voltage of Vin is 20 mV, the ADC quantization level. In practice at 100 HZ sampling rate and n=19, R=10 Mohm and C=4.7 µF. The operational amplifier is used to buffer the signal so that it can be added into the signal being digitised.

If n were 16 an effective improvement of 4 bits results i.e., an 8 bit ADC would effectively improve to 12 bits accuracy when measuring static or randomly varying signals within a linear system.

An advantage of this method is simple implementation although a disadvantage is the necessity ot trim R to achieve a one bit peak to peak amplitude.

Figure 7:
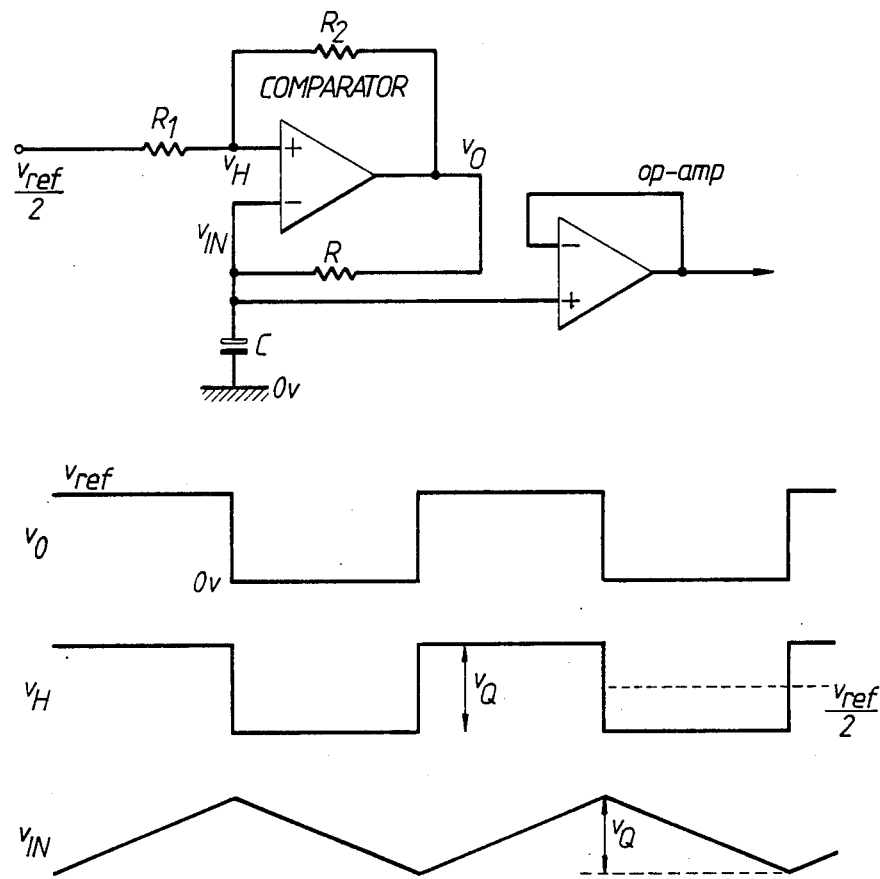
FIG. 7A shows a second circuit for QED generation and FIGS. 7B-7D show various waveforms associated with the QED generation circuit of FIG. 7A.

FIG. 7 illustrates a circuit for asynchronous generation of a triangular waveform.

The circuit of FIG. 7 generates a dual ramp waveform at $V_{in}$ by virtue of self oscillation. The comparator is configured as a Schmitt inverter and the hysteresis at the negative input is controlled by the ratio of the two resistors $R_1$ and $R_2$. The frequency at which the circuit oscillates in controll by R and C. This frequency should be low compared with the sampling frequency of 100 HZ and the improvement in accuracy will then be limited only by the limitations of the input comparator on the ADC with respect to aperture time and accuracy. Theoretically the accuracy on a constant power load can be improved by an infinite degree. Practically the improvement in conversion accuracy can be by a factor of 6 or 8 bits or more giving an equivalent accuracy of conversion of 14 or 16 bits or even more.

In a typical circuit with R=10 MOhm, C=1 µF, $R_2$=100 KΩ and $R_1$=390 Ohms the peak to peak amplitude will be 20 mV and the oscillation frequency about 4.5 HZ.

The advantage of this circuit are the precisely defined amplitude depending on two resistors, therefore requiring no setting up, and the better improvement in conversion accuracy resulting from the asynchronous signal.

Although we have described this circuit with reference to an asynchronous period at around 4.5 HZ, it could equally well be configured so as to run at any frequency which is asynchronous with the means frequency such as a frequency close to mains of around 90 HZ or 110 HZ or several times mains frequency such as 900 HZ. All these frequencies so long as they are asynchronous will 'run through' the mains frequency with the same result of producing a linearly distributed quantization error dispersion signal and consequently a true average sample result.

There may be some practical difficulties however with ADC or sample-holding aperture time if the QED signal operates at a rate which is too high. Even then the sampling and digitising process may not be too upset if the errors due to this cause are linearly distributed in both positive and negative directions.

Figure 8:
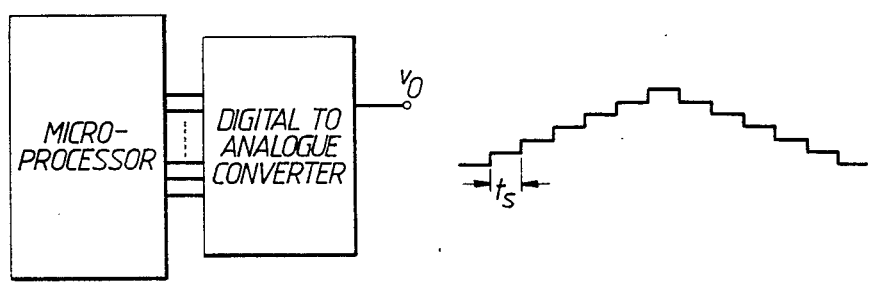
FIG. 8A shows a third circuit for QED generation and FIG. 8B shows the staircase output produced thereby.

The circuit of FIG. 8 depicts another technique for QED generation. In this circuit the microprocessor is used to drive a digital to analogue converter using a number of output port lines.

The output count changes by one bit each time a sample has been taken. This is a synchronous scheme and although an asynchronous system is possible with a separately clocked counter driving the DAC little practically advantage results.

A disadvantage of this circuit configuration is extra cost and complexity and an 8-bit DAC would be required to give accuracy comparable with the asynchronous analogue generation method.

Figure 9:
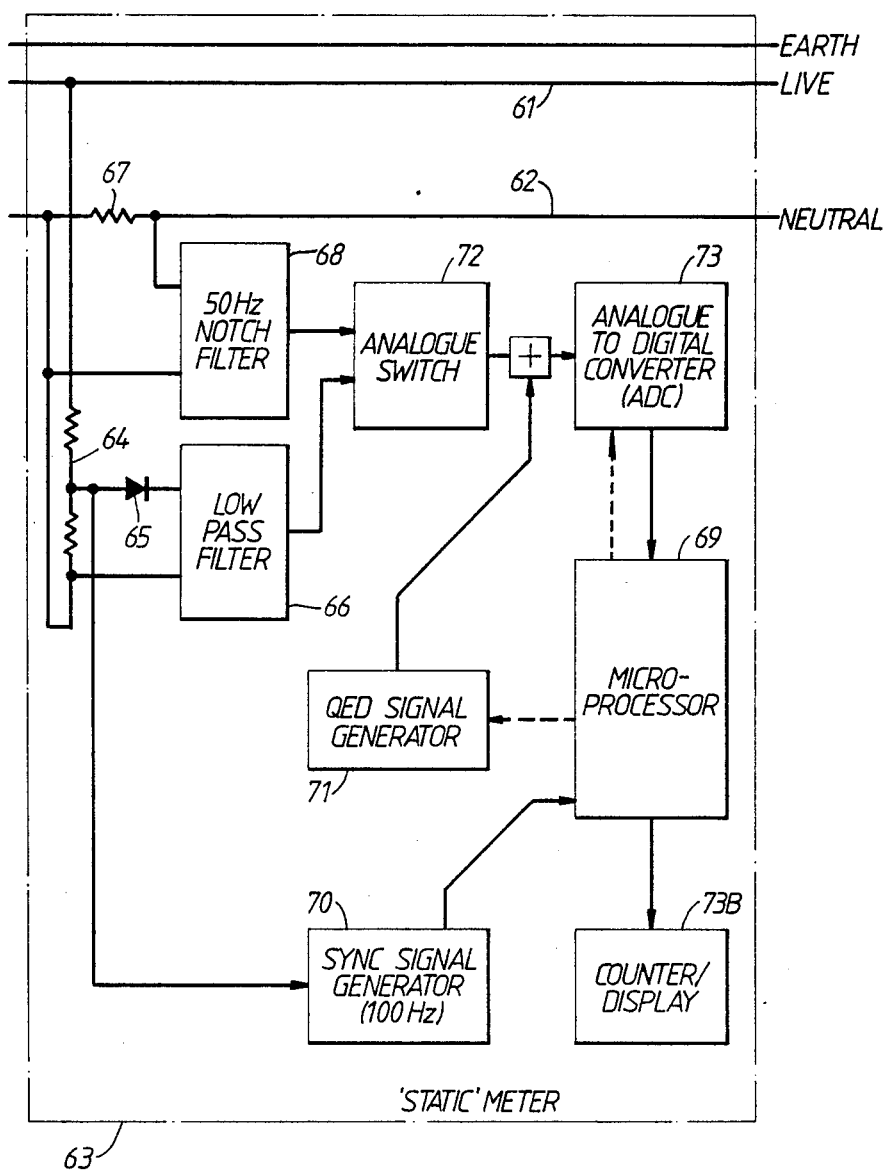
FIG. 9 shows a complete implementation in block schematic form of a single phase sampling kilowatt hour meter employing QED.

FIG. 9 illustrates the functioning of a complete single phase electronic electricity meter incorporating QED in block diagram form.

The live and neutral conductors, 61 and 62 supply current through the static meter 63. Voltage is sensed by means of a potential divider 64, rectifier 65, and low pass filter 66. Current is sensed by means of a current shunt 67 and a 50 HZ notch filter 68. The notch filter 68 provides a signal to the analogue switch which signifies the amplitude and phase of the 50 HZ component of the current waveform. The varying dc level at the output of the low pass filter 66 signifies the amplitude of the mains voltage.

Since the only current component which conveys power when the mains is sinusoidal is the 50 HZ fundamental, digitised values of current fundamental and mains voltage are all that are required by the processor 69 to calculate power and hence energy. Phase information for correct sampling time is supplied by the sync circuit 70 which informs the processor of every mains zero crossing occurrence.

In order to incorporate QED, a QED generator 71 functioning according to any convenient circuit produces a one digit level peak to peak signal with rectangular probability distribution which is added to the voltage or current signal at the output of the analogue switch 72, before sampling by the ADC, 73. The ADC may be of the 'flash converter' type or of a slower type in which case an analogue sample and hold circuit may be incorporated within the ADC function 73.

The microprocessor 69, controls the sampling of the two signals in sympathy with the mains timing delivered by the sync circuit 70. The QED circuit 71, is alternatively driven by a synchronous voltage provided by the processor 69 or may be asynchronously driven by its own timing element, as described previously within this description.

The processor calculates from current and voltage samples the energy consumed and provides output pulses indicative of whole numbers of kWh or units of electricity consumed or fractions thereof. These pulses are used to drive a remote or local display of kWh on a display 73B. The display can be of electromechanical or electronic form.

In the case of multiphase meters the principles of QED are applied in a similar manner to those described in the single phase case. Real, reactive and apparent current components as well as phase to phase and phase to neutral voltages are measured using the QED accuracy improvement technique so that a highly accurate measurement of kWh, kVArh, and kVAh are produced in the one instrument.

Figure 10:
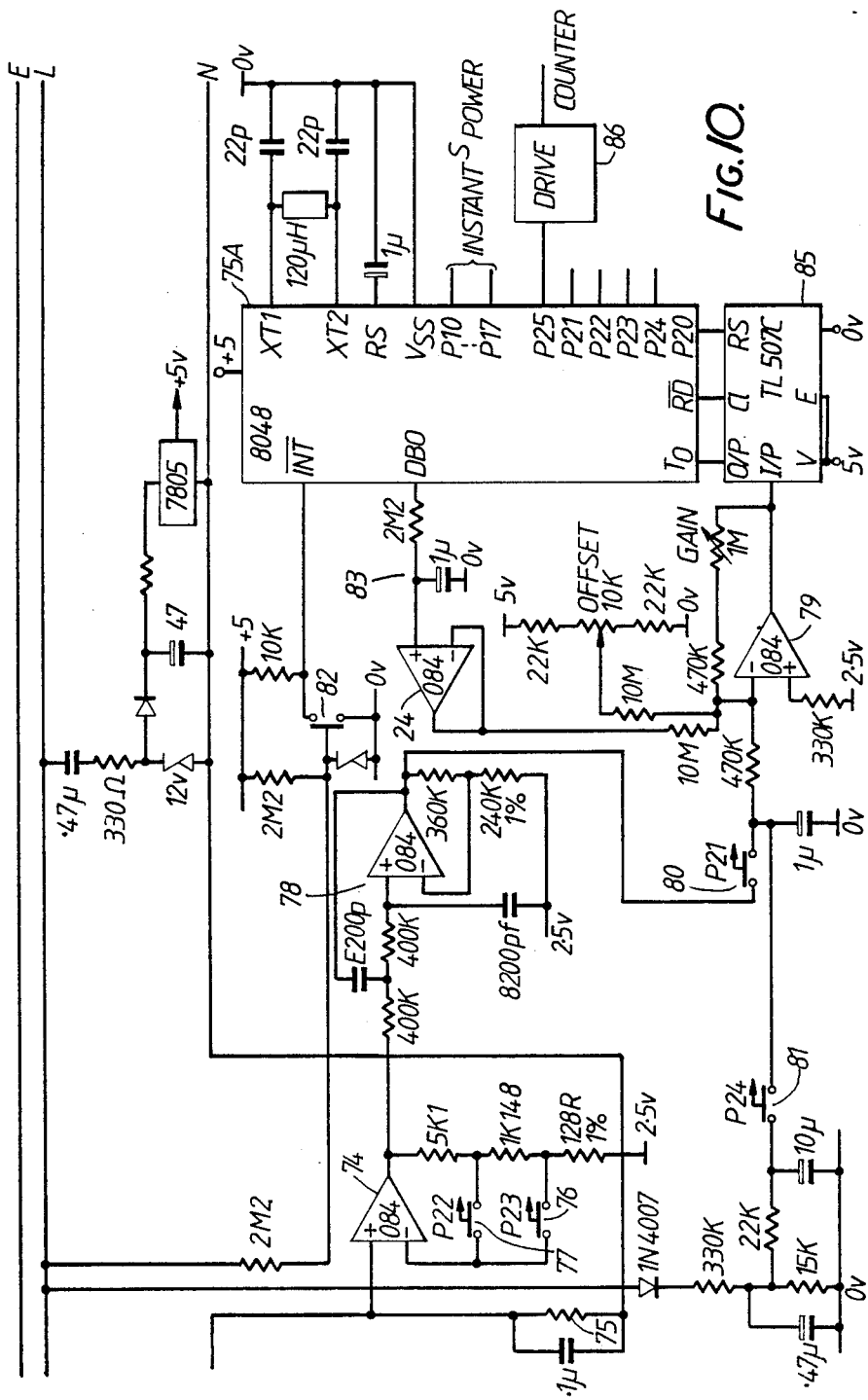
FIG. 10 shows a detailed circuit diagram of a circuit for a single phase static kilowatt hour meter employing the principles of QED shown in FIG. 9.

Having described the principles of QED accuracy improvement with respect to FIG. 9, we now show an example of a complete circuit embodiment of a static electricity meter incorporating QED with reference to FIG. 10.

In the circuit of FIG. 10 current is sensed by the amplifier, 74, in a current shunt, 75, in the neutral supply line. Since there can arise errors at low signal voltages, due to inherent circuit noise, Intel 8048 processor, 75A ignores current signal levels within a zero dead band of typically one or two digitising levels. This constrains the range of the meter to 1 to 100 or so. For this reason the sensing amplifier has two ranges of sensitivity, $\times 10$ and $\times 1$, controlled by the processor through analogue switches 76 and 77 so that the dynamic range of the meter can then be 1000 to 1 or so.

The output of the amplifier is filtered by the 50 HZ Sallenkey filter 78 and fed to the input of the operational amplifier 79 through another analogue switch 80. The operational amplifier is fed with either the current sync or voltage sync through analogue switch 80 or 81. All analogue switches are controlled by the processor apart from switch 82 sensing the mains voltage zero crossing times.

In this implementation as asynchronous QED signal is generated by the processor and a square wave drive signal is generated on the data bus zero line at 1/19 mains ferquency. This is converted to a triangular wave by the low pass integrating filter 83, a CR filter, buffered by the amplifier 84 and fed into the inverting input of the operation amplifier 79, in parallel with the voltage or current signal. The QED signal injected at this point is arranged to have a peak to peak value of one digitising level when sensed at the input to the ADC 85.

The processor calculates the integrated energy cycle by cycle of the mains waveform and generates a counter drive pulse on port 2.5 output for every kWh of electricity consumed (or part or multiple of one kWh). The pulse is used to activate a pulse counter through drive circuitry 86.

Figure 11:
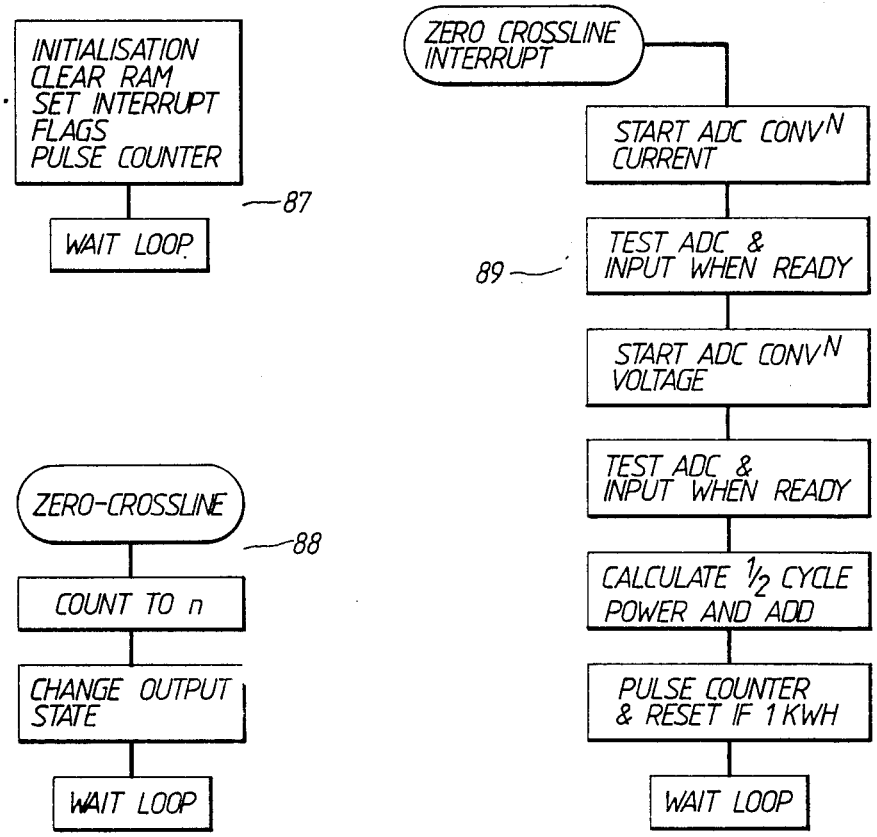
FIG. 11 shows a software diagram for the processor utilised in the detailed embodiment of FIG. 10.

FIG. 11 shows the broad principles of the software employed by the process 75A of the detailed embodiment. Typically the coding of this software requires less than 1000 bytes of machine code and is suitable for an EPROM 8748 or mask-programmed 8048. Three functions are shown which are the initialisation function 87, the QED drive voltage generation 88, and the energy computation 89.

When such a circuit is utilised for instantous power computation it is evident that such a power computation should always be calculated from a number of samples equal to the QED drive waveform period—in this case 19 cycles or approximately a 1/5 second average. The circuit of FIG. 6 shows instantaneous power output as a parallel 8-bit signal on part 1,0 to 1,7.

We claim:

1. Electronic watt-hour electricity supply metering apparatus, comprising:
   supply voltage sensing means for producing a first voltage representative of the supply voltage to the load, said first voltage being proportional to the magnitude of the fundamental frequency component of the supply voltage;
   load current sensing means for producing a second voltage representative of the current supplied to the load, said second voltage being proportional to the amplitude of the fundamental frequency component of the load;
   sampling circuits for deriving first and second signals related to said first and second voltages, respectively, said sampling circuits being extended in dynamic range by an error dispersion signal;
   linear voltage amplification means for amplifying said first and second voltages;
   digital sampling means coupled to said linear voltage amplification means for producing said first and second signals and including an analog-to-digital converter;
   voltage generation means for generating a third voltage;
   voltage addition means for adding said third voltage to said first and second voltages, respectively, said third voltage being an alternating voltage without DC bias and cyclically varying with a peak-to-peak value equal to an integral number, at least equal to one, of a complete digitizing level of said analog-to-digital converter;
   said analog-to-digital converter sampling the output signal of said voltage addition means and deriving said first and second signals;
   said third voltage having a rectangular probability distribution and a frequency substantially different from the frequency of said supply voltage;
   digital processor means controlling said analog-to-digital converter to effect samples of said output signal of said voltage addition means at a frequency equal to or less than twice the supply frequency and at the times of occurrence of the zero crossing and voltage peaks of said first voltage and at the peaks of said second voltage, and calculating therefrom the parameters relating to energy consumption of the load, the parameters being the apparent fundamental energy and apparent instantaneous fundamental power (VI), real fundamental energy and power (VI cos $\phi$), or reactive fundamental energy and power (VI sin $\phi$) supplied to the load.

2. Apparatus according to claim 1, wherein the added cyclically varying voltage is triangular in waveform.

3. Apparatus according to claim 1, wherein the added cyclically varying waveform is sawtooth in waveform.

4. Apparatus according to claim 1, wherein the peak-to-peak amplitude of said third voltage is an integral multiple of the quantization resolution of said analog-to-digital converter.

5. Apparatus according to claim 1, wherein the frequency of said third voltage is asynchronous with the frequency of said supply voltage and at a frequency which is many times, but not a precise integral multiple of, the supply frequency.

6. Apparatus according to claim 1, wherein the frequency of said third voltage is close to, but different from, the frequency of said supply voltage.

7. Apparatus according to claim 1, wherein the third voltage is synchronized to a submultiple of the frequency of said supply voltage.

8. Apparatus according to claim 1, wherein said third voltage is synchronously generated with respect to any multiple or submultiple of the frequency of said supply voltage.

9. Apparatus according to claim 1, wherein said third voltage is applied to both said first and said second voltages.

10. Apparatus according to claim 9, wherein the apparatus is a single phase electricity supply-metering apparatus.

* * * * *